(12) United States Patent
Lin

(10) Patent No.: US 7,761,268 B2
(45) Date of Patent: Jul. 20, 2010

(54) NON-LINEAR TRANSIENT ANALYSIS MODULE AND METHOD FOR PHASE LOCKED LOOP

(75) Inventor: Zhi-Ming Lin, Changhua (TW)

(73) Assignee: National Changua University of Education, Changhua (TW)

(*) Notice: Subject to any disclaimer, the term of this patent is extended or adjusted under 35 U.S.C. 154(b) by 659 days.

(21) Appl. No.: 11/743,229

(22) Filed: May 2, 2007

(65) Prior Publication Data
US 2008/0275679 A1 Nov. 6, 2008

(51) Int. Cl.
*G06G 7/48* (2006.01)
(52) U.S. Cl. ........................................... 703/4
(58) Field of Classification Search ............. 703/3, 703/4; 375/215, 327
See application file for complete search history.

(56) References Cited

U.S. PATENT DOCUMENTS
5,596,280 A * 1/1997 Riggio, Jr. ............... 324/606

2002/0114417 A1 * 8/2002 McDonagh ............... 375/376

* cited by examiner

*Primary Examiner*—Paul L Rodriguez
*Assistant Examiner*—Andre Pierre Louis
(74) *Attorney, Agent, or Firm*—Thomas, Kayden, Horstemeyer & Risley

(57) ABSTRACT

A non-linear transient analysis module and method for phase locked loop (PLL) is disclosed. The method includes a pulse cycle defined by the larger period of two input frequencies; a pulse width defined by the accumulation value of period difference. Each pulse cycle is divided into two linear regions, a first voltage at the beginning of the pulse cycle as an initial value then applying a first linear equation to obtain a second voltage, and then the second voltage as an initial value then applying a second linear equation to obtain a third voltage which is used to be an initial value for next pulse cycle. An average voltage of the first region and the second region is inputted into the VCO to generate an output as the PFD input. The aforementioned steps are repeated to complete a simulation of PLL transient response.

5 Claims, 3 Drawing Sheets

NON-LINEAR TRANSIENT ANALYSIS MODULE AND METHOD FOR PHASE LOCKED LOOP

BACKGROUND

1. Field of Invention

The present invention relates to a non-linear transient analysis module and method for a phase locked loop. More particularly, the present invention relates to a non-linear transient analysis module and its method that uses two calculation techniques on a cycle by cycle and piecewise linear basis for phase locked loop in the time domain.

2. Description of Related Art

Phase locked loop (PLL) circuits are widely used in wireless communication systems and control systems. The phase locked loop circuits are essential parts especially for frequency modulation and demodulation in System on Chip (SoC) integrated circuits.

In the early days, the PLL circuits were pure analog circuits. Since in those days there were no computer for simulation and calculation, circuit analyses was done by hand calculation. Any active circuits which consist of transistors or old vacuum tubes are essentially non-linear circuits. Thus signals need to be small enough so that the transistors and the vacuum tubes are operated in the linear regions.

Analog/Mixed-signal integrated circuits design is more and more complicated so the conventional simulation tools SPICE (Simulation Program with Integrated Circuit Emphasis), which is a program used in circuit description and simulation, or FastSPICE (Fast Simulation Program with Integrated Circuit Emphasis) do not satisfy the demands of SoC in simulation speed and design capacity.

EDA (Electronic Design Automation) enables digital simulators (ex. Verilog) and analog simulators (ex. SPICE) to be used simultaneously, and then develops a co-simulation environment for design and verification, which is so-called mixed-mode simulation, in order to improve the predicament.

Process of mixed-signal circuit design often encounters the problem of using Verilog and SPICE for co-simulation. A conventional method converts the results of the Verilog into the SPICE format, and then the simulator in the SPICE simulates the transistor-level circuit.

As a result the mixed-signal circuits design has become more complicated. There are two ways to improve the simulation speed and the design capacity of the analog circuit. One is to develop a more powerful analog simulator such as FastSPICE. The improvement is obvious when used in a repetitive circuit. The other is to design the analog behavior model of the analog circuit, but the analog behavior model varies. The parameter design of the analog circuit is not easy because simulation accuracy must be considered. The analog behavior model design is still a trend of circuit design in the feature.

The present invention uses the non-linear transient analysis method to process the piecewise linear calculation. The analysis needs only two calculations per cycle, takes only a few seconds and is very fast by comparison with an HSPICE simulation developed by MetaSoftware company where the HSPICE needs hundreds of thousands of calculations.

SUMMARY

To eliminate and mitigate the aforementioned problems, the present invention discloses a non-linear transient analysis module and method for phase locked loop to satisfy these demands.

An object of the present invention is to provide a non-linear transient analysis module for phase locked loop, which uses two calculation techniques on a cycle by cycle and piecewise linear basis.

According to an embodiment of the present invention, a non-linear transient analysis module includes a phase locked loop behavior model comprising a PFD (phase/frequency detector) behavior model, an LF (loop filter) behavior model and a VCO (Voltage Controlled Oscillator) behavior model.

The PFD behavior model is substantially equal to the HSPICE voltage/current source after an initial condition i.e. a reference frequency is received by the phase locked loop behavior model, wherein the PFD behavior model computes a first pulse in the form of one of an adequate voltage and an adequate current.

The LF behavior model receives the first pulse and produces an output voltage to drive the VCO behavior model to generate a clock signal.

The VCO behavior model outputs the clock signal. The period of the clock signal has a cumulative effect corresponding to the control voltage. The VCO behavior model actually outputs an average VCO frequency $<F_{osc}>$.

The aforementioned behavior models provide related circuit setting parameters for PLL to optimize the whole circuit performance.

Another object of the present invention is to provide a non-linear transient analysis method for phase locked loop, the method uses two calculation techniques on a cycle by cycle and piecewise linear basis, and comprises:

(a) providing a phase/frequency detector with an output signal comprising multiple pulse cycles and converting each of the pulse cycles in the form of piecewise linear format, (b) dividing each pulse cycle into two linear regions comprising a first region and a second region, (c) setting a first initial voltage value of a first linear equation by a first voltage value at the beginning of a current one of the pulse cycles, and calculating the first linear equation in the first region to obtain a second voltage value, (d) setting a second initial voltage value of a second linear equation by the second voltage value, and calculating the second linear equation in the second region to obtain a third voltage value to be an initial voltage value for a next one of the pulse cycles, (e) obtaining an average voltage of the first region and the second region as an input voltage inputted to a VCO to produce an output signal inputted into the PFD, and (f) repeating the steps of (b), (c), (d) and (e) to complete a simulation of PLL transient response.

According to the aforementioned steps and embodiments, the present invention has advantages as follows.

1. The simulation time of the HSPICE is greatly reduced. The conventional simulation method requires hundreds of thousands of calculations for a cycle so that the calculation takes at least a few days.

2. Circuit designers can take more time to optimize the circuit performance because of a reduced simulation time in the circuit design.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
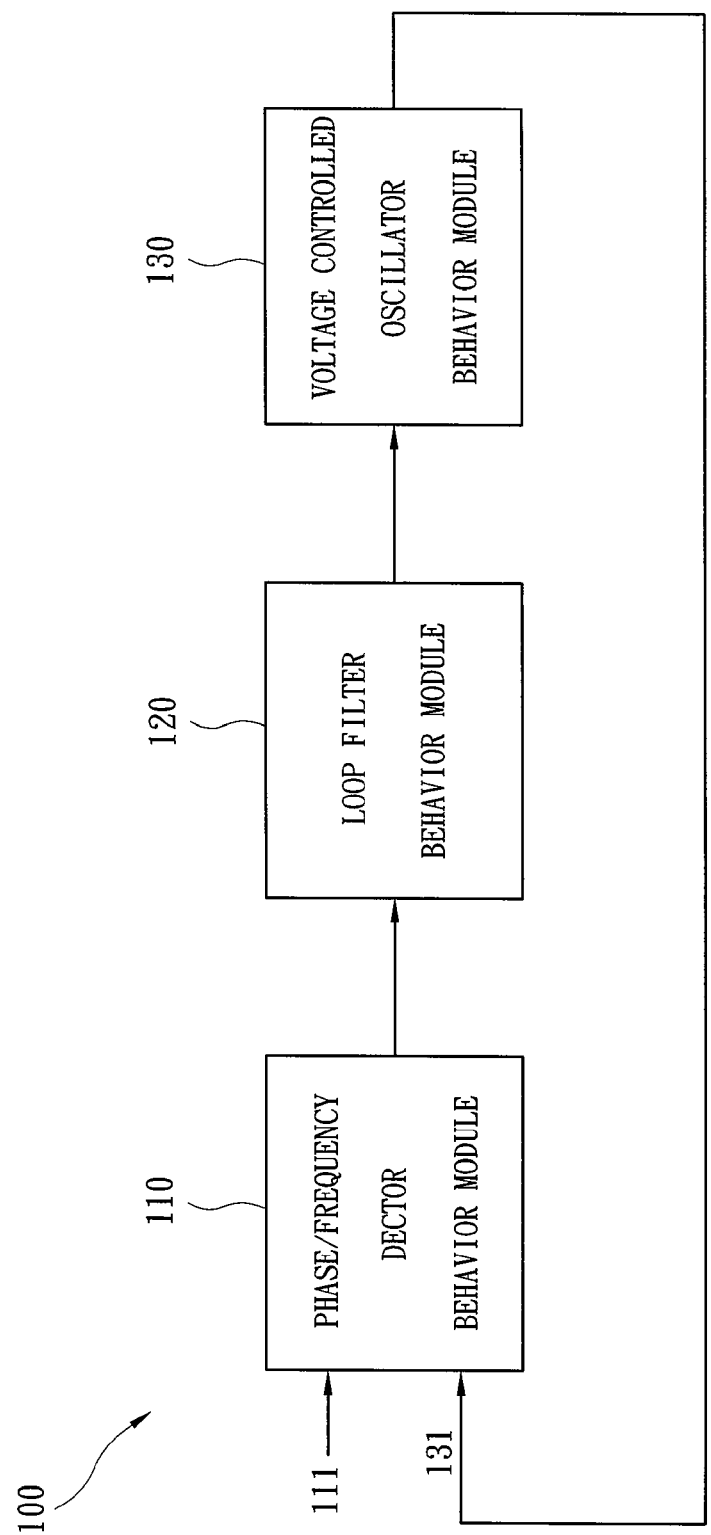
FIG. 1 is a diagram of a phase locked loop behavior model of a preferred embodiment in accordance with the present invention.

Reference will now be made in detail to the present preferred embodiments of the invention, examples of which are illustrated in the accompanying drawings. Wherever possible, the same reference numbers are used in the drawings and the description to refer to the same or like parts.

Refer to FIG. 1. FIG. 1 illustrates a preferred embodiment of a phase locked loop behavior model in accordance with the present invention. The phase locked loop (PLL) behavior model 100 includes a phase/frequency detector (PFD) behavior model 110, a loop filter (LF) behavior model 120 and a voltage controlled oscillator (VCO) behavior model 130.

The PFD behavior model 110 is substantially equal to the HSPICE voltage/current source, PULSE, in the process of the phase locked loop design. The aforementioned behavior models 110, 120 and 130 provide the related circuit setting parameter for PLL to optimize the whole circuit performance. Additionally, the three behavior models 110, 120 and 130 are linked together by a program. An embodiment in accordance with the present invention, the program is written by the MATLAB (Matrix Laboratory) programming language.

After an initial condition i.e. a reference frequency 111 is inputted in the PLL behavior model 100, the PFD behavior model 110 computes a first pulse. The first pulse may be in the form of an adequate voltage or an adequate current. When the first pulse is inputted into the loop filter behavior model 120, the LF behavior model 120 produces an output voltage to drive the voltage controlled oscillator behavior model 130 to generate a clock signal.

The VCO behavior model 130 generates the clock signal. A period of the clock signal has a cumulative effect corresponding to the control voltage so the VCO behavior model 130 outputs an average VCO frequency 131 $<F_{osc}>$. Thus, the average VCO frequency 131 $<F_{osc}>$ is described by equation (1) below:

$$<F_{osc}> = F_0 + K_{osc} <V_{cntl}> \tag{1}$$

where $F_0$ is the zero bias free running frequency, $K_{osc}$ is frequency per volt and $<V_{cntl}>$ is the average control voltage. Equation (1) is applied to describe the VCO behavior model 130.

The average control voltage $<V_{cntl}>$ is treated as an estimate to compute a next pulse and a new $<V_{cntl}>$. The new $<V_{cntl}>$ is continuously repeated to use for the pulse calculation as previously described. If the difference of $<V_{cntl}>$ between two adjacent cycles is smaller than a given margin of error, the pulse calculation is stopped.

Figure 2:
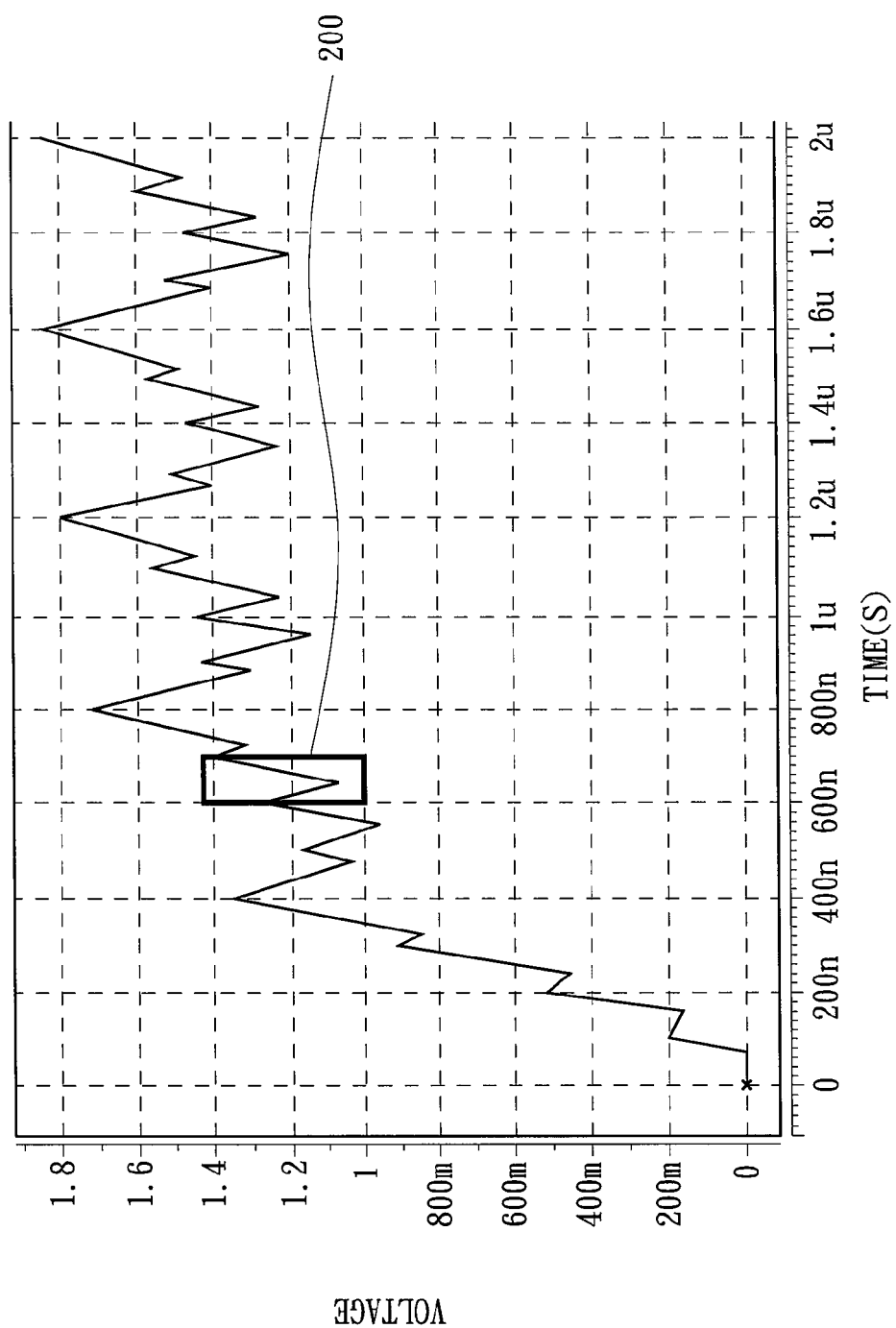
FIG. 2 is a graph of output voltage of a loop filter by HSPICE simulation in accordance with the present invention.
Figure 3:
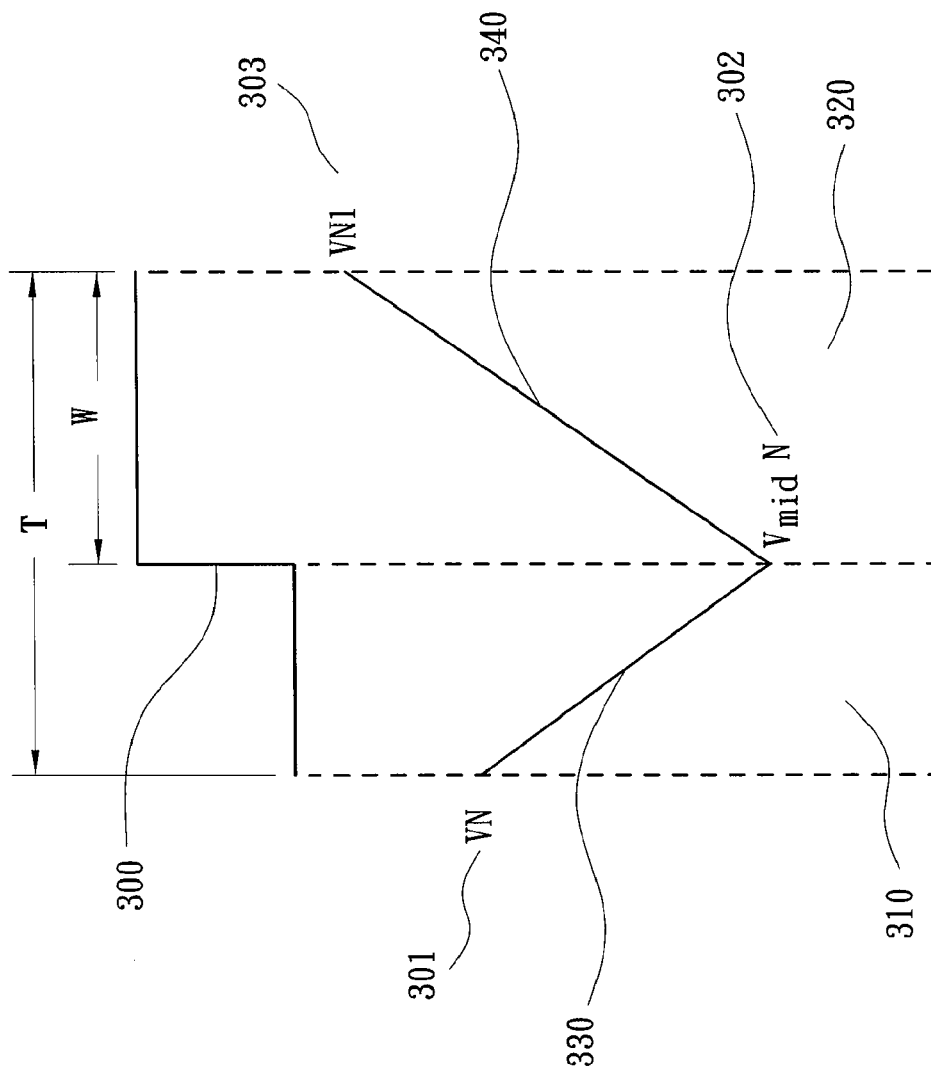
FIG. 3 is an enlarged view of the loop filter output within one pulse cycle in FIG. 2.

Refer to FIG. 2 and FIG. 3. FIG. 2 illustrates an output voltage of a loop filter by HSPICE simulation in accordance with the present invention. FIG. 3 illustrates an enlarged view of the loop filter output within one pulse cycle in FIG. 2.

In FIG. 2, HSPICE uses very small time intervals to divide each pulse cycle into piecewise linear format. The embodiment adopts the larger one between the cycle of the input reference signal 111 of the PFD behavior model 110 and the cycle of the output signal 131 of the VCO behavior model 130 to be a pulse cycle T of output signal of the PFD behavior model (Refer to FIG. 3). When an accumulated value of period differences of the two signals is smaller than the pulse cycle, the accumulation value is a pulse width W of PFD output (Refer to FIG. 3). When an accumulated value of period differences of the two signals is greater than pulse cycle, subtracting the accumulated value by a smaller one of the two signal cycles obtains a pulse width. Thus, each pulse cycle is converted in the form of piecewise linear format according to the pulse cycle and the pulse width.

The signal in a frame 200 is shown in FIG. 3. A pulse cycle is illustrated in FIG. 3. A pulse cycle 300 of the PFD output is divided into two linear regions comprising a first region 310 and a second region 320. Thus, one single pulse cycle only needs to be calculated twice.

At the beginning of the pulse cycle T, the first voltage 301 is VN. The second voltage 302 ($V_{mid}N$) is calculated by the first voltage 301 and a first linear equation 330 in the first region 310. A third voltage 303 (VN1) is calculated by the second voltage 302 and a second linear equation 340 in the second region 320. Averaging voltages of the first region 310 and the second region 320 can gain an average control voltage $<V_{cntl}>$ of the pulse cycle T. Additionally, the third voltage 303 is used as the first voltage 301 for a next one of the pulse cycles. Repeating the aforementioned procedures completes simulations of the entire PLL transient response. The first linear equation 330 and the second linear equation 340 are described by equation (2) and (3) respectively:

$$V_{mid}N = VN(1-(T-W)) \div \tau_p \tag{2}$$

$$VN1 = V_{mid}N + (\text{sign}V_m - V_{mid}N) W \div \tau_p \tag{3}$$

where T is a pulse cycle, W is a pulse width, $V_m$ is a pulse amplitude, $\tau_p$ is a time constant of the loop filter, VN is a first voltage, $V_{mid}N$ is a second voltage, and VN1 is a third voltage. If the period of the VCO output signal 131 is greater than the period of the PFD input reference signal 111, sign=1, otherwise, sign=−1.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-linear transient analysis method for phase locked loop, and the method comprising:
   (a) providing a phase/frequency detector with an output signal comprising multiple pulse cycles and converting each of the pulse cycles in the form of piecewise linear format;
   (b) dividing each pulse cycle into two linear regions comprising a first region and a second region;
   (c) setting a first initial voltage value of a first linear equation by a first voltage value at the beginning of a current one of the pulse cycles, and calculating the first linear equation in the first region to obtain a second voltage value, wherein the first linear equation is defined:

$$V_{mid}N = VN(1-(T-W)) \div T_p$$

where T is a pulse cycle, W is a pulse width, $T_p$ is a time constant of the loop filter, VN is a first voltage and $V_{mid}N$ is a second voltage;
   (d) setting a second initial voltage value of a second linear equation by the second voltage value, and calculating the second linear equation in the second region to obtain a third voltage value to be an initial voltage value for a next one of the pulse cycles;

(e) obtaining an average voltage of the first region and the second region as an input voltage inputted to a voltage controlled oscillator to produce an output signal inputted into the phase/frequency detector; and (f) repeating the steps of (b), (c), (d) and (e) to complete a computation of phase locked loop transient response.

2. A non-linear transient analysis method for phase locked loop, the method comprising:

(a) providing a phase/frequency detector with an output signal comprising multiple pulse cycles and converting each of the pulse cycles in the form of piecewise linear format;

(b) dividing each pulse cycle into two linear regions comprising a first region and a second region;

(c) setting a first initial voltage value of a first linear equation by a first voltage value at the beginning of a current one of the pulse cycles, and calculating the first linear equation in the first region to obtain a second voltage value;

(d) setting a second initial voltage value of a second linear equation by the second voltage value, and calculating the second linear equation in the second region to obtain a third voltage value to be an initial voltage value for a next one of the pulse cycles, wherein the second linear equation is described by:

$$VN1 = V_{mid}N + (\text{sign} V_m - V_{mid}N) W \div T_p$$

where W is a pulse width, $T_p$ is a time constant of the loop filter, $V_m$ is a pulse amplitude, the sign=1 when the period of the VCO output signal is greater than the period of the PFD input reference signal, otherwise, sign=−1, $V_{mid}N$ is a second voltage and VN1 is a third voltage;

(e) obtaining an average voltage of the first region and the second region as an input voltage inputted to a voltage controlled oscillator to produce an output signal inputted into the phase/frequency detector; and (f) repeating the steps of (b), (c), (d) and (e) to complete a computation of phase locked loop transient response.

3. A non-linear transient analysis machine for a phase locked loop, and the machine comprising:

means for receiving an initial condition;

means for computing a first pulse after the initial condition is received;

means for receiving the first pulse; and means for outputting a clock signal, wherein the clock signal has a period with a cumulative effect corresponding to a control voltage, and outputs an average voltage controlled oscillator frequency $<F_{osc}>$, wherein the average voltage controlled oscillator frequency $<F_{osc}>$ is defined by:

$$<F_{osc}> = F_0 + K_{osc} <V_{cntl}>$$

where $F_0$ is the zero bias free running frequency, $K_{osc}$ is frequency per volt and $<V_{cntl}>$ is the average control voltage.

4. The non-linear transient analysis machine for phase locked loop of claim 3, wherein the control voltage is in the form of an adequate voltage.

5. The non-linear transient analysis machine for phase locked loop of claim 3, wherein the control voltage is in the form of an adequate current.

* * * * *